(12) United States Patent
Rubenstein

(10) Patent No.: US 9,886,068 B2
(45) Date of Patent: Feb. 6, 2018

(54) CABLE MANAGEMENT TECHNIQUES FOR COMPUTING SYSTEMS

(71) Applicant: Microsoft Technology Licensing, LLC, Redmond, WA (US)

(72) Inventor: Brandon Rubenstein, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 12 days.

(21) Appl. No.: 15/064,867

(22) Filed: Mar. 9, 2016

(65) Prior Publication Data

US 2017/0262028 A1   Sep. 14, 2017

(51) Int. Cl.
*H05K 7/20* (2006.01)
*G06F 1/18* (2006.01)
*H05K 7/14* (2006.01)

(52) U.S. Cl.
CPC .............. *G06F 1/187* (2013.01); *G06F 1/181* (2013.01); *H05K 7/1491* (2013.01)

(58) Field of Classification Search
CPC ..................................................... G06F 1/1616
See application file for complete search history.

(56) References Cited

U.S. PATENT DOCUMENTS

| | | | |
|---|---|---|---|
| 5,216,579 A * | 6/1993 | Basara | G06F 1/184 174/481 |
| 6,944,383 B1 | 9/2005 | Herzog et al. | |
| 7,480,154 B2 | 1/2009 | Lawrence et al. | |
| 9,584,879 B2 * | 2/2017 | Takeuchi | A47B 81/00 |
| 2005/0274842 A1 * | 12/2005 | Rubenstein | H02G 11/00 242/615.3 |
| 2006/0171651 A1 | 8/2006 | Laursen | |
| 2009/0242233 A1 | 10/2009 | Ueda | |
| 2010/0282932 A1 | 11/2010 | Ong et al. | |
| 2012/0012714 A1 | 1/2012 | Rubenstein et al. | |

(Continued)

FOREIGN PATENT DOCUMENTS

| | | |
|---|---|---|
| EP | 0288000 A2 | 10/1988 |
| EP | 1111747 B1 | 6/2001 |

(Continued)

OTHER PUBLICATIONS

"Cisco UCS 5108 Server Chassis Installation Guide", Published on: Apr. 26, 2014, Available at: http://www.cisco.com/c/en/us/td/docs/unified_computing/ucs/hw/chassis-install-guide/ucs5108_install/ucs5108_install_chapter_010.html.

(Continued)

*Primary Examiner* — Anthony Q Edwards
(74) *Attorney, Agent, or Firm* — Liang IP, PLLC

(57) ABSTRACT

Cable management systems, devices, and associated methods of installation and operation are disclosed herein. In one embodiment, an enclosure for holding computer components includes a front panel, a back panel, and a side panel between the front panel and the back panel. The side panel has a first side facing an interior space of the enclosure and a second side facing away from the first side. The enclosure also includes a guide panel proximate to the side panel, the guide panel being spaced apart from the second side of the side panel by a gap extending at least partially between the front panel and the back panel. The enclosure also includes a cable anchor located in the gap between the side panel and the guide panel.

20 Claims, 7 Drawing Sheets

(56) References Cited

U.S. PATENT DOCUMENTS

| | | |
|---|---|---|
| 2012/0127648 A1 | 5/2012 | Randall et al. |
| 2012/0193485 A1 | 8/2012 | Yu et al. |
| 2012/0241187 A1 | 9/2012 | Gong et al. |
| 2013/0003317 A1 | 1/2013 | Gong et al. |
| 2013/0266283 A1* | 10/2013 | Baldassano .......... G02B 6/4452 385/135 |
| 2014/0022755 A1 | 1/2014 | Saito |
| 2014/0097000 A1 | 4/2014 | Lin et al. |
| 2014/0313662 A1 | 10/2014 | Aoki |
| 2015/0189787 A1 | 7/2015 | Bailey et al. |
| 2015/0351287 A1 | 12/2015 | Eichelberg |

FOREIGN PATENT DOCUMENTS

| | | |
|---|---|---|
| JP | S5914377 U | 1/1984 |
| JP | S59132675 U | 9/1984 |
| JP | H0165189 U | 4/1989 |

OTHER PUBLICATIONS

"Installing the Server Into a Rack With Slide-Rails", Published on: Dec. 13, 2013, Available at: http://docs.oracle.com/cd/E19477-01/820-5827-13/rack_install.html#50614309_99582.

"International Search Report and Written Opinion Issued in PCT Application No. PCT/US2017/020300", dated May 16, 2017, 12 Pages.

* cited by examiner

CABLE MANAGEMENT TECHNIQUES FOR COMPUTING SYSTEMS

BACKGROUND

Cloud computing facilities can include a large number of servers, data storage devices, network components, and other types of components housed in drawers, racks, cabinets, containers, buildings, or other types of enclosures. The various components in cloud computing facilities are typically interconnected to one another via cables. For example, one or more Serial ATA ("SATA") cables can connect multiple drawers holding hard disk drives ("HDDs") to a drive controller external to the drawers. In operation, the drive controller can monitor and manage various operations of the HDDs located in the drawers.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Hot swapping generally involves replacing or installing a component (e.g., an HDD) in a computer without shutting down the computer. Hot swapping allows quickly plugging or unplugging of components without interrupting overall operations of the computer. In cloud computing facilities, slide mounted enclosures (e.g., drawers or trays) can be used to allow swift hot swapping. For example, an installer can slide a drawer from a retracted position to an open position, and then readily access HDDs in the drawer.

One challenge associated with slide mounted enclosures is how to adequately accommodate sliding motions with connected cables. Certain enclosures can include an articulating arm located at back of the enclosures to regulate cables. For example, when a drawer is sliding toward an open position, the articular arm can expand to provide length and guide associated cables at the back of the drawer. When the drawer is sliding toward a retracted position, the articulating arm can then fold to reduce length. However, such articulating arms may not adequately accommodate cables located at front of the drawer without significantly increasing routing complexities and/or lengths of the cables.

Several embodiments of the disclosed technology are directed to cable management techniques that can accommodate slide mounted enclosures with one or more front-accessed cables. In certain embodiments, a slide mounted enclosure can include a front panel at a front end, a back panel at a back end, and one or more side panels between the front and back ends. The side panel can have a first side facing toward an interior space of the enclosure and a second side opposite the first side. The enclosure can also include a guide panel spaced apart from the second side of the side panel by a gap and a cable anchor located in the gap between the side panel and the guide panel.

During installation, a cable can be routed from the front panel of the enclosure into the gap, around the cable anchor, and exit the gap at or proximate the front end. A first terminal of the cable can be engaged with a port on the front panel of the enclosure while a second terminal of the cable can be engaged with another port on a front panel of another enclosure. In certain embodiments, the cable anchor can have a suitable shape and size to prevent a portion of the cable in the gap from moving toward the first end. In other embodiments, the cable anchor can fixedly attach a point in the cable to the side panel of the enclosure. As such, the cable in the gap can be prevented from moving relative to the side panel during opening or closing of the enclosure. In any of the foregoing embodiments, the installed cable can form a half loop around the cable anchor when the enclosure is in a retracted position.

In operation, a user can slide the enclosure from a retracted position toward an open position along a direction extending from the back end toward the front end of the enclosure. As the enclosure slides relative to the guide panel, the first terminal of the cable travels with the front panel while the cable extends between the first terminal and the second terminal. At the end of the slide, the cable can be fully extended at a length that approximates (or longer than) a travel distance of the enclosure between the retracted position and an open position. The user can also retract the enclosure by sliding the enclosure in the reverse direction. As the enclosure slides relative to the guide panel, the cable coils around the cable anchor to reform a half loop.

DETAILED DESCRIPTION

Certain embodiments of cable management systems, devices, components, assemblies, and related processes are described below. In the following description, specific details of components are included to provide a thorough understanding of certain embodiments of the disclosed technology. A person skilled in the relevant art will also understand that the disclosed technology may have additional embodiments or may be practiced without several of the details of the embodiments described below with reference to FIGS. 1-8.

As used herein, the term "enclosure" generally refers to a housing, a casing, or other suitable types of structure configured to contain and accommodate certain electronic components. In one example, an enclosure can include a slide mounted drawer configured to house processors, computer storage devices, router, switches, or other suitable electronic components. In other examples, enclosures can also be trays, containers, racks, cabinets, or other suitable mechanical structures that can house various electronic components.

In cloud computing facilities, slide mounted enclosures (e.g., drawers or trays) can be used to allow ready access to components in the enclosures. For example, a user can slide a drawer from a retracted position to an open position, and hot swap an HDD or other computer components in the drawer. One challenge associated with slide mounted enclosures is to adequately accommodate sliding motions with front-accessed cables. Certain enclosures can include structures such as articulating arms at the back of enclosures. However, articulating arms may not adequately accommodate cables at the front of the enclosures without significantly increasing routing complexities and/or lengths of the cables. Several embodiments of the disclosed technology are directed to cable management techniques that can accommodate slide mounted enclosures with one or more front-accessed cables, as described in more detail below with reference to FIGS. 1-8.

Figure 1:
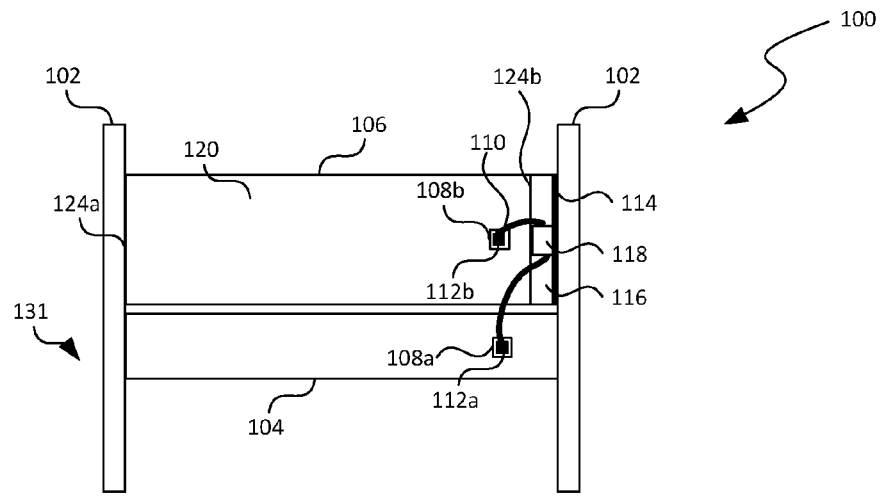
FIG. 1 is a schematic front view of a computing system utilizing enclosures having cable management components in accordance with embodiments of the present technology.

FIG. 1 is a schematic front view of a computing system 100 having enclosures with certain cable management components in accordance with embodiments of the present technology. As shown in FIG. 1, the computing system 100 can include multiple support structures 102, a controller enclosure 104, and an electronic enclosure 106. The support structures 102 can include columns, pillars, walls, or other suitable structures configured to carry the controller enclosure 104 and the electronic enclosure 106 in a stack or other suitable arrangement. Even though only one controller enclosure 104 and one electronic enclosure 106 are shown in FIG. 1 for illustration purposes, in other embodiments, the computing system 100 can include additional electronic enclosures, controller enclosures, communications enclosures, or other suitable components in addition to or in lieu of those shown in FIG. 1.

The controller enclosure 104 can include components configured to monitor, control, manage, or otherwise facilitate operations of electronic components in the electronic enclosure 106. For example, in one embodiment, the controller enclosure 104 can include an HDD controller. In another embodiment, the controller enclosure 104 can include one or more routers, switches, hubs, bridges, gateways, or other suitable types of network devices. The network devices can facilitate communications of the electronic components in the electronic enclosure 106 with other components (not shown) of the computing system 100. In further embodiments, the controller enclosure 104 can include a combination of the foregoing and/or other suitable components.

As shown in FIG. 1, the controller enclosure 104 can include a first communications port 108a at a front edge 131 of the controller enclosure 104. The first communications port 108a can allow components in the controller enclosure 104 to communicate with those in the electronic enclosure 106. In one embodiment, the first communications port 108a can include a SATA port. In another embodiment, the first communications portion 108a can also include an Ethernet port, fiber optic port, or other suitable types of port. Even though only one first communications port 108a is shown in FIG. 1, in other embodiments, the controller enclosure 104 can also include additional ports located at or proximate the front end or the back end of the controller enclosure 104.

The electronic enclosure 106 can be a slide mounted drawer, tray, or other suitable housing configured to contain various suitable components. For example, in one embodiment, components of the electronic enclosure 106 can include multiple HDDs (e.g., forty, sixty, or eighty HDDs) configured as a network storage node. In another embodiment, the electronic enclosure 106 can also include a network server having, for example, a motherboard carrying one or more processor, memory devices, persistent storage devices, and/or other suitable components. One example electronic enclosure 106 are described in more detail below with reference to FIG. 2. Though not shown in FIG. 1, to accommodate the sliding motions of the electronic enclosure 106, the computing system 100 can also include rails, locks, spacers, or other suitable mechanical components, for example, mounted on the support structures 102. The description of such mechanical components are omitted herein for clarity and conciseness.

The electronic enclosure 106 can be configured to manage one or more front-accessed cables. As shown in FIG. 1, the electronic enclosure 106 can include a front panel 120 coupled to a first side panel 124a and a second side panel 124b. The first and second side panels 124a and 124b are opposite each other. The electronic enclosure 106 can include a second communications port 108b at the front panel 120. In certain embodiments, the second communications port 108b can be generally similar to the first communications port 108a at the controller enclosure 104. In other embodiments, the first and second communications ports 108a and 108b can have different configurations. In further embodiments, the electronic enclosure 106 can include two, three, or any suitable number of communications ports (not shown) at or proximate the front panel 120.

In the foregoing embodiments, a cable 110 connecting the first and second communications ports 108a and 108b can allow components in the controller enclosure 104 and the electronic enclosure 106 to communicate with one another. The cable 110 can have a first terminal 112a engaged with the first communications port 108a and a second terminal 112b engaged with the second communications port 108b. In certain embodiments, the cable 110 can include a SATA cable. In other embodiments, the cable 110 can include an Ethernet, fiber optic, or other suitable types of cable with corresponding terminations. As described below, the electronic enclosure 106 can include cable management features that allow the cable 110 to accommodate sliding motions of the electronic enclosure 106 in an orderly and efficient manner.

As shown in FIG. 1, the electronic enclosure 106 can include a guide panel 114 that is generally parallel to and spaced apart from the second side panel 124b by a gap 116 extending at least partially between the front panel 120 and the back panel 122. The gap 116 can have a size suitable to accommodate a thickness of the cable 110 or other suitable sizes. In certain embodiments, the guide panel 114 can be stationary, for example, by being fixedly attached to the corresponding support structure 102. In other embodiments, the guide panel 114 can be attached to the second side panel 124b using, for example, brackets. As such, the guide panel 114 can travel along with the second side panel 124b during sliding of the electronic enclosure 106. In the illustrated embodiment, the electronic enclosure 106 can also include a cable anchor 118 located in the gap 116 and extending between the second side panel 124b and the guide panel 114. In other embodiments, the cable anchor 118 may have other configurations or be omitted. The foregoing components of the computing system 100 can accommodate sliding motions of the electronic enclosure 106 relative to the controller enclosure 104 in an orderly and efficient manner, as described in more detail below with reference to FIGS. 2-3E.

Figure 2:
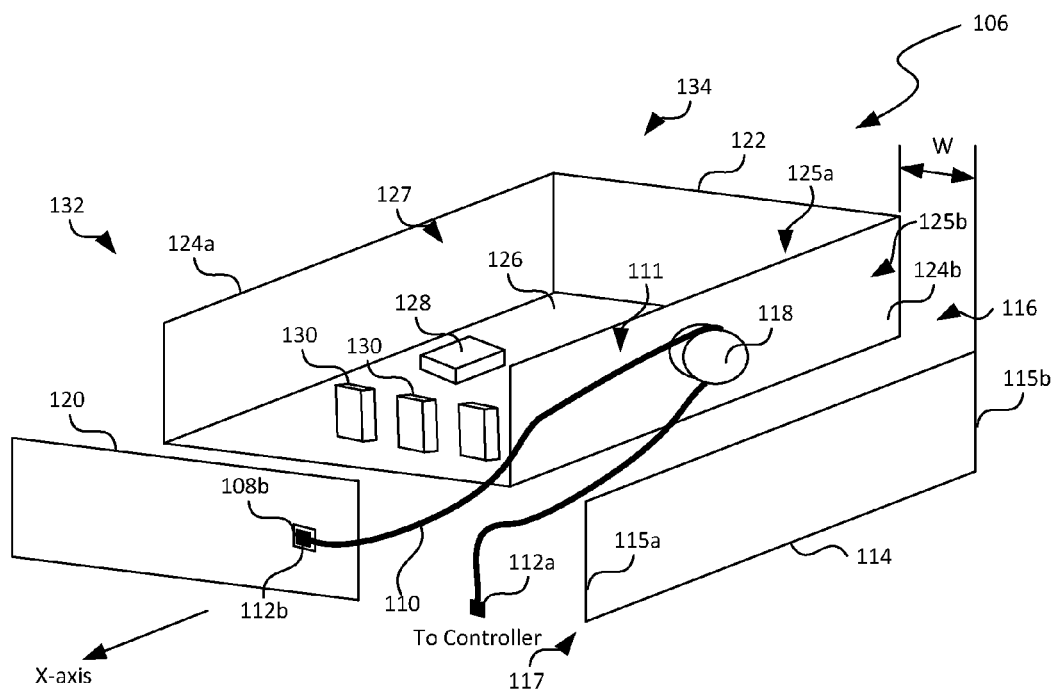
FIG. 2 is an exploded schematic perspective view of an electronic enclosure suitable for the computing system in FIG. 1 in accordance with embodiments of the present technology.

FIG. 2 is an exploded schematic perspective view of an electronic enclosure 106 suitable for the computing system 100 in FIG. 1 in accordance with embodiments of the present technology. In FIG. 2 and other figures herein, similar references identify similar components in structure and function. As shown in FIG. 2, the electronic enclosure 106 can include a front panel 120 at a front end 132, a back panel 122 at a back end 134, and first and second side panels 124a and 124b between the front panel 120 and the back panel 122. The electronic enclosure 106 can also include a bottom panel 126 carrying one or more motherboards, daughter boards, or other suitable printed circuit boards (not shown). The foregoing panels 120, 122, 124a, 124b, and 126 can be constructed from a metal, a metal alloy, a plastic, or other suitable materials with sufficient mechanical strengths, and can be coupled together via welding, pressure fitting, fastening, or other suitable techniques. Even though the panels 120, 122, 124a, 124b, and 126 are shown as solid plate-like structures in FIG. 2, in certain embodiments, these components can also include meshes, slits, channels, holes, or other suitable features.

The electronic enclosure 106 can carry various electronic components. For example, as shown in FIG. 2, the electronic enclosure 106 can carry one or more processor 128 and computer storage devices 130 (e.g., HDDs). The computer storage devices 130 can be removable storage devices, non-removable storage devices, or a combination thereof. Examples of removable storage and non-removable storage devices include magnetic disk devices such as flexible disk drives and HDD, optical disk drives such as compact disk (CD) drives or digital versatile disk (DVD) drives, solid state drives (SSD), and tape drives. Example computer storage devices can include volatile and nonvolatile, removable and non-removable media implemented in any method or technology for storage of information, such as computer readable instructions, data structures, program modules, or other data. As used herein, the terms "computer storage devices," "computer storage media," and "computer readable storage media" exclude propagated signals and communication media. In other embodiments, the electronic enclosure 106 can also carry additional and/or different electronic components than those shown in FIG. 2.

Also shown in FIG. 2, the second side panel 124b can include a first side 125a facing toward an interior space 127 of the electronic enclosure 106. The second side panel 124b can also include a second side 125b opposite the first side 125a and facing away from the interior space 127 and the first side 125a. The guide panel 114 can include a first end 115a and a second end 115b. The gap 116 can have an opening 117 proximate to the front end 115a of the guide panel 114. In the illustrated embodiment, the electronic enclosure 106 can include a cable anchor 118 in the gap 116 between the front panel 120 and the back panel 122. The cable anchor 118 can have a generally cylindrical shape extending from the second side 125b of the second side panel 124b toward the guide panel 114. The cable anchor 118 can have a size that occupies the entire width W of the gap 116 or a portion thereof. In other embodiments, the cable anchor 118 can have other suitable shapes and sizes, as described in more detail below with reference to FIGS. 4-8.

In certain embodiments, during installation, the second terminal 112b of the cable 110 can be initially engaged with the second communications port 108b, for example, proximate the first end 115a of the guide panel 114. The cable 110 can then be routed into the gap 116 at the front end 132 toward the cable anchor 118 and the back end 134. The cable 110 can then be routed around the cable anchor 118 and toward the front end 132 until the cable 110 exits the gap 116. The first terminal 112a can then be engaged with the first communications port 108a (FIG. 1) on the controller enclosure 104. In other embodiments, the foregoing installation operations may be performed in a reversed order, or in other suitable orders. As shown in FIG. 2, the cable 110 can have a cable portion 111 inside the gap between the front end 132 and the cable anchor 118, forming a half loop. The half loop formed by the cable portion 111 can facilitate sliding motions of the electronic enclosure 106 in an orderly and efficient manner, as described in more detail below with reference to FIGS. 3A-3E.

FIGS. 3A-3E are schematic perspective view of the electronic enclosure 106 in FIG. 2 at various positions when sliding between a retracted position and an open position and in accordance with embodiments of the present technology. The guide panel 114 and other components of the electronic enclosure 106 are shown either partially, in phantom lines, or omitted in FIGS. 3A-3E for clarity.

Figure 3A:
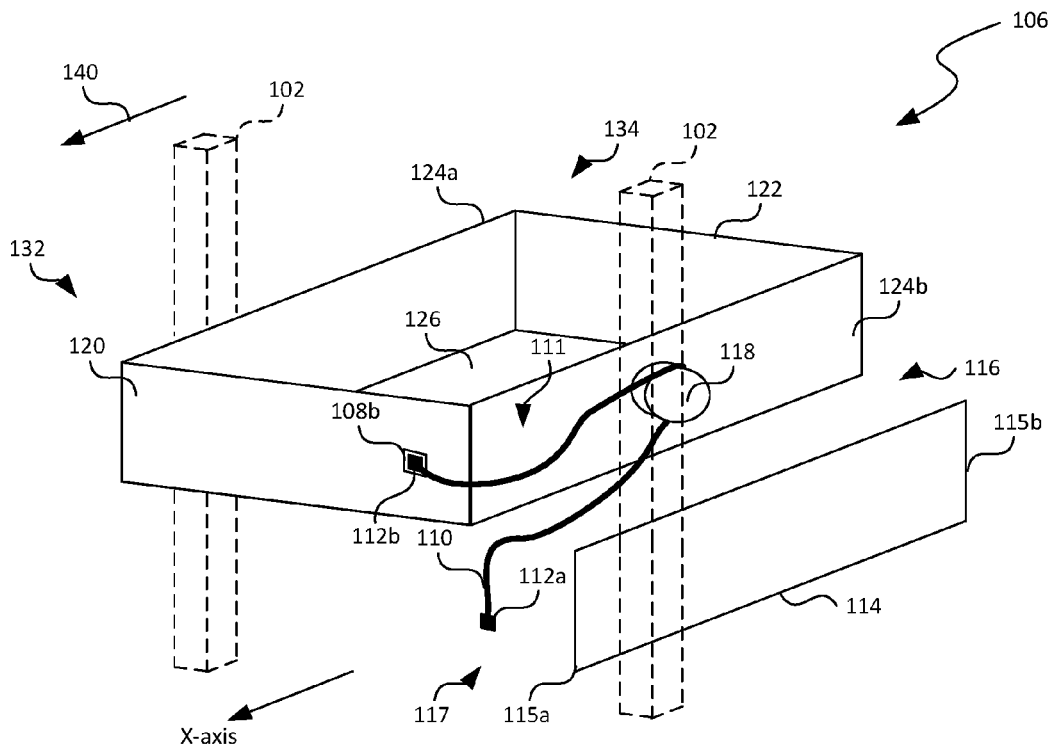
FIGS. 3A-3E are schematic perspective view of the electronic enclosure in FIG. 2 at various positions when moved between a retracted position and an open position and in accordance with embodiments of the present technology.
Figure 3B:
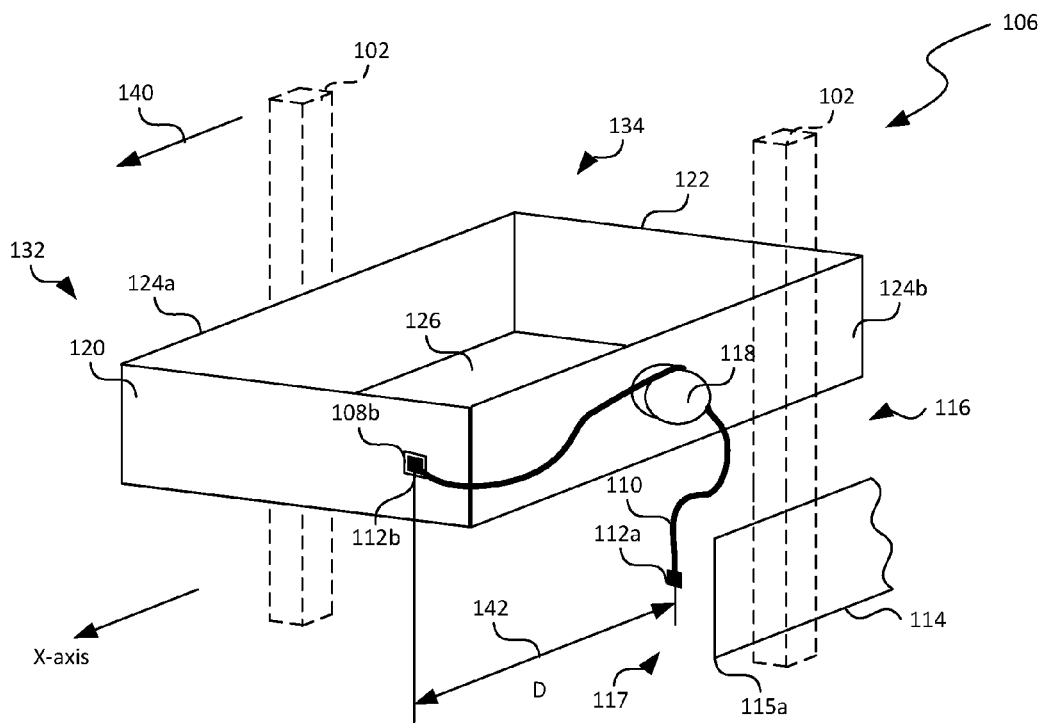
Figure 3C:
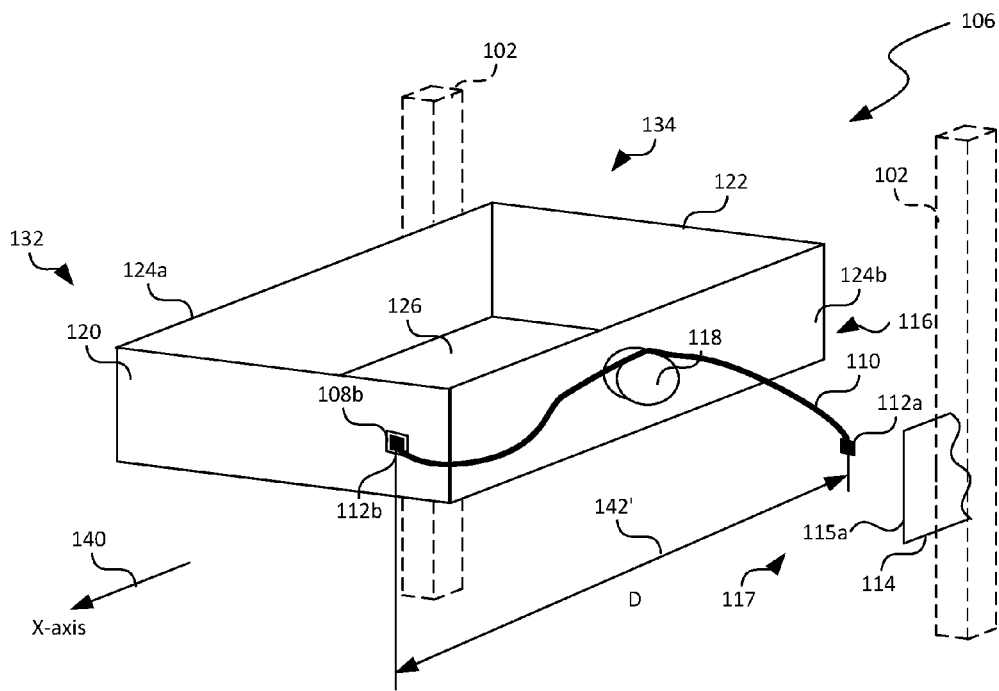

FIGS. 3A-3C illustrate the electronic enclosure 106 at various positions when moved from a retracted position to an open position. In particular, FIG. 3A shows the electronic enclosure 106 in a retracted position at which the first and second terminals 112a and 112b of the cable 110 are generally aligned along the x-axis in a direction 140 extending from the back end 134 toward the front end 132. The cable portion 111 in the gap 116 forms a half loop around the cable anchor 118. As the electronic enclosure 106 moves in the direction 140 along the x-axis, the cable portion 111 extends or unfolds to accommodate the travel of the electronic enclosure 106. For example, FIG. 3B shows the electronic enclosure 106 at an intermediate position between the retracted position and an open position. As shown in FIG. 3B, the first and second terminals 112a and 112b of the cable 110 begins to separate from each other along the x-axis, as indicated by the separation distance D 142.

As the electronic enclosure 106 travels farther from the intermediate position shown in FIG. 3B, the cable portion 111 can continue to extend to accommodate the further movement and the separation distance D 142 increases. FIG. 3C shows an open position for the electronic enclosure 106 at which the cable 110 can fully extend to unfold the half loop formed by the cable portion 111 shown in FIG. 3A. As a result, the cable 110 can extend linearly between the first and second terminals 112a and 112b. As shown in FIG. 3C, at the open position, the separation distance D between the first and second terminals 112a and 112b can correspond to an extreme travel distance of the electronic enclosure 106. As such, the cable portion 111 can have a length that is generally similar to, equal to, or longer than the separation distance D shown in FIG. 3C. The length of the cable portion 111 can be set, adjusted, or otherwise determined during installation of the cable 110.

Figure 3D:
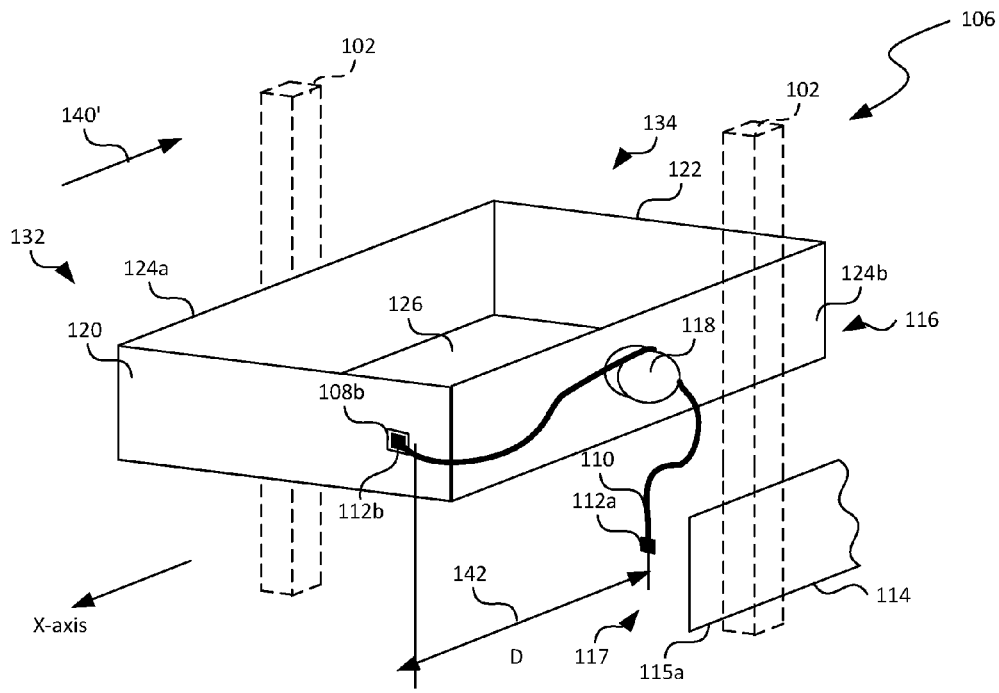
Figure 3E:
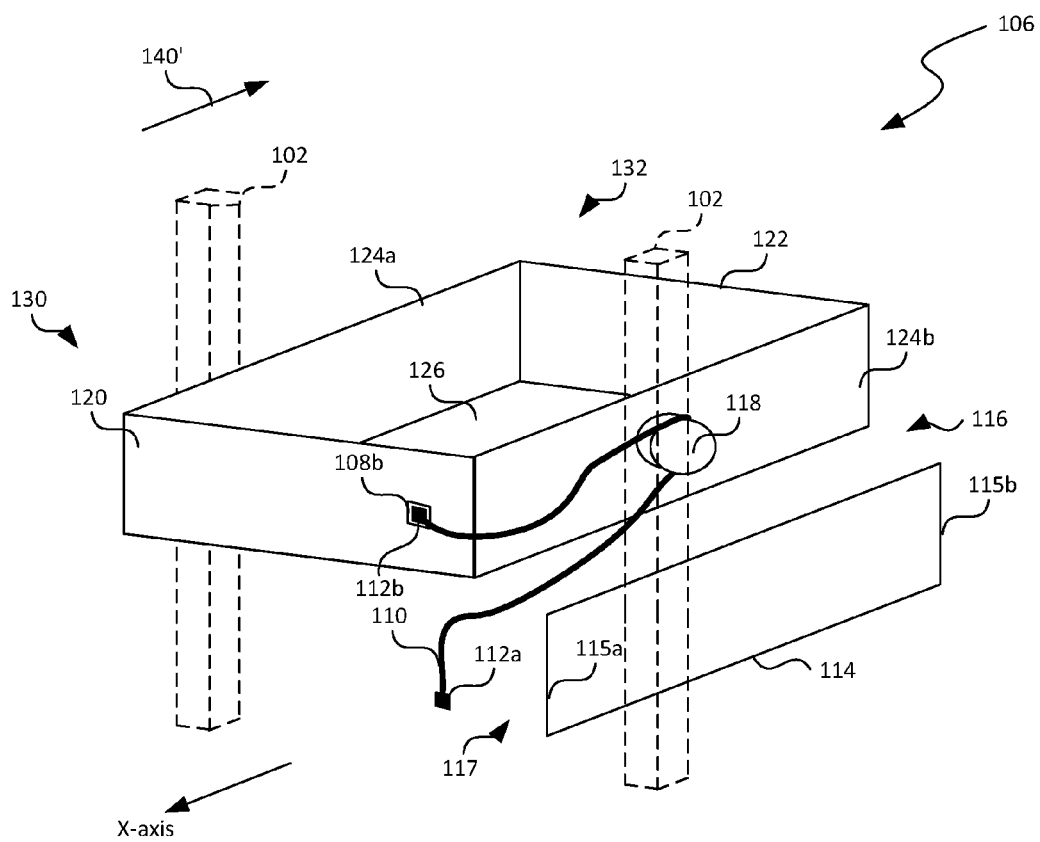

FIGS. 3D-3E illustrate the electronic enclosure 106 at various positions when moved from the open position shown in FIG. 3C to a retracted position. As shown in FIG. 3D, as the electronic enclosure 106 moves in the reverse direction 140', the separation distance D 142 decreases from that shown in FIG. 3C. The electronic enclosure 106 can continue to move until reaching the retracted position. During the movement, the cable 110 continues to fold around the cable anchor 118 to reform the half loop, as shown in FIG. 3E. At the retracted position, the first and second terminals 112a and 112b can be generally aligned along the x-axis.

As such, the cable portion 111 in the gap 116 can fold or unfold around the cable anchor 118 to accommodate movements of the electronic enclosure 106 relative to the controller enclosure 104 (FIG. 1) or other neighboring enclosures. The gap 116 can also prevent or at least reduce a risk of the cable 110 being entangled, twisted, excessively bent, or otherwise unable to fold or unfold during movements of the electronic enclosure 106. As a result, embodiments of the electronic enclosure 106 can accommodate sliding motions in an orderly and efficient manner.

Even though particular embodiments of the electronic enclosure 106 are shown in FIGS. 1-3E, in other embodiments, the electronic enclosure 106 can have other suitable configurations. For example, even though only one gap 116 spaced part from the second side panel 112b is shown in FIGS. 1-3E, in certain embodiments, the electronic enclosure 106 can also include an additional gap (not shown) and associated cable anchor (not shown) spaced apart from the first side panel 112a to accommodate additional cables. Also, even though a single half loop is shown in FIGS. 1-3E, in other embodiments, the cable 110 can also form multiple loops or half-loops around the cable anchor 118. Further, the cable anchor 118 can have additional structures, configurations, and arrangements as described in more detail below with reference to FIGS. 4-8.

Figure 4:
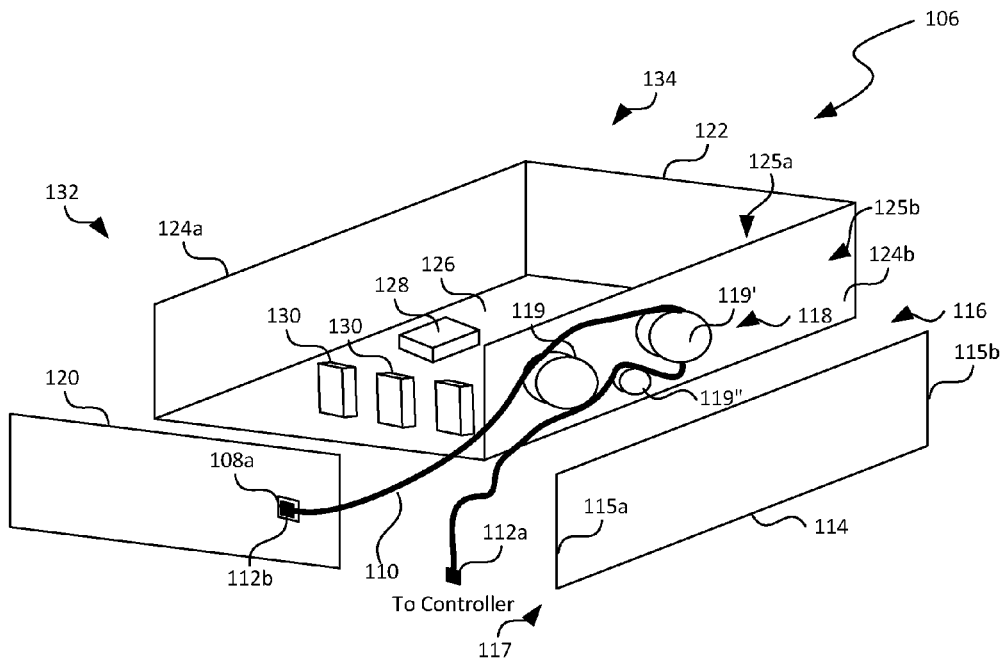
FIG. 4 is an exploded schematic perspective view of another electronic enclosure suitable for the computing system in FIG. 1 in accordance with embodiments of the present technology.

FIG. 4 is an exploded schematic perspective view of another electronic enclosure 106 suitable for the computing system 100 in FIG. 1 in accordance with embodiments of the present technology. As shown in FIG. 4, instead of having a single structure as the cable anchor 118 in FIG. 2, the cable anchor 118 can have first, second, and third separate structures 119, 119', and 119" arranged along the x-axis to individually support a section of the cable 110 thereon. In other embodiments, the cable anchor 118 can also include two, four, five, or any suitable number of separate structures in any suitable arrangements.

Figure 5:
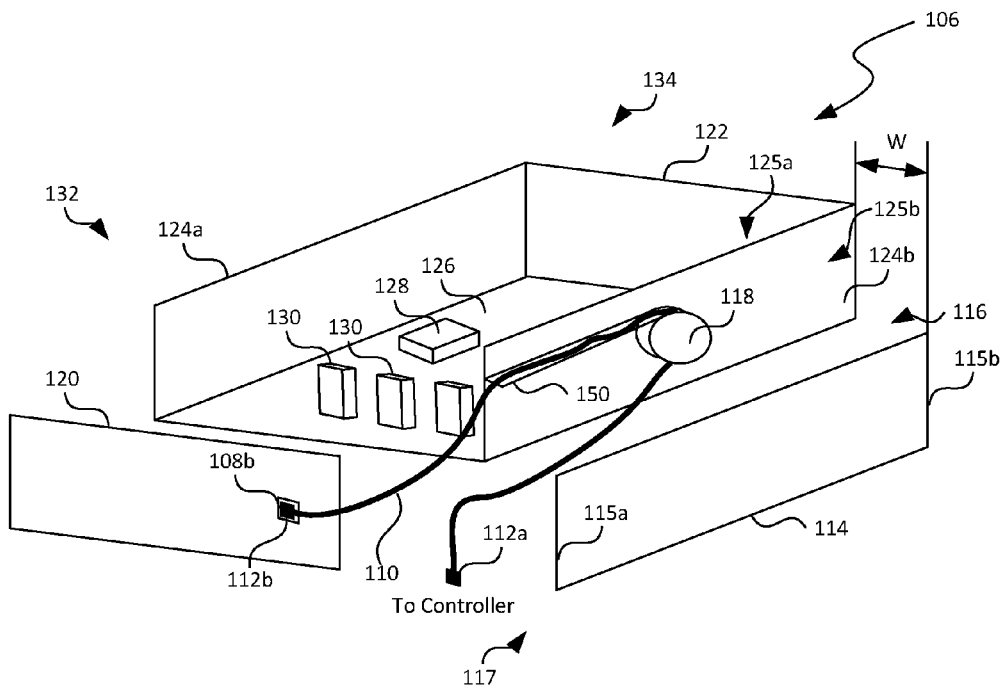
FIG. 5 is an exploded schematic perspective view of yet another electronic enclosure suitable for the computing system in FIG. 1 in accordance with embodiments of the present technology.

FIG. 5 is an exploded schematic perspective view of yet another electronic enclosure 106 suitable for the computing system 100 in FIG. 1 in accordance with embodiments of the present technology. As shown in FIG. 5, the electronic enclosure 106 can further include a shelf 150 (e.g., a strip) extending from approximately the first end 132 toward the cable anchor 118. The shelf 150 can extend from the second side 125b of the second side panel 124b toward the guide panel 114.

In certain embodiments, the shelf 150 can have a width that is generally equal to a width W of the gap 116. In other embodiments, the shelf 150 can have a width that is smaller than the width W of the gap 116 but still sufficient to accommodate the cable 110, for example, to allow a segment of the cable 110 to rest thereon. Even though only one shelf 150 is shown in FIG. 5, in other embodiments, the electronic enclosure 106 can also include an additional shelfs (not shown) that can accommodate additional segments of the cable 110. In yet further embodiments, the electronic enclosure 106 can also include rails, clips, conduits, or other suitable components that can hold or support the cable 110.

Figure 6:
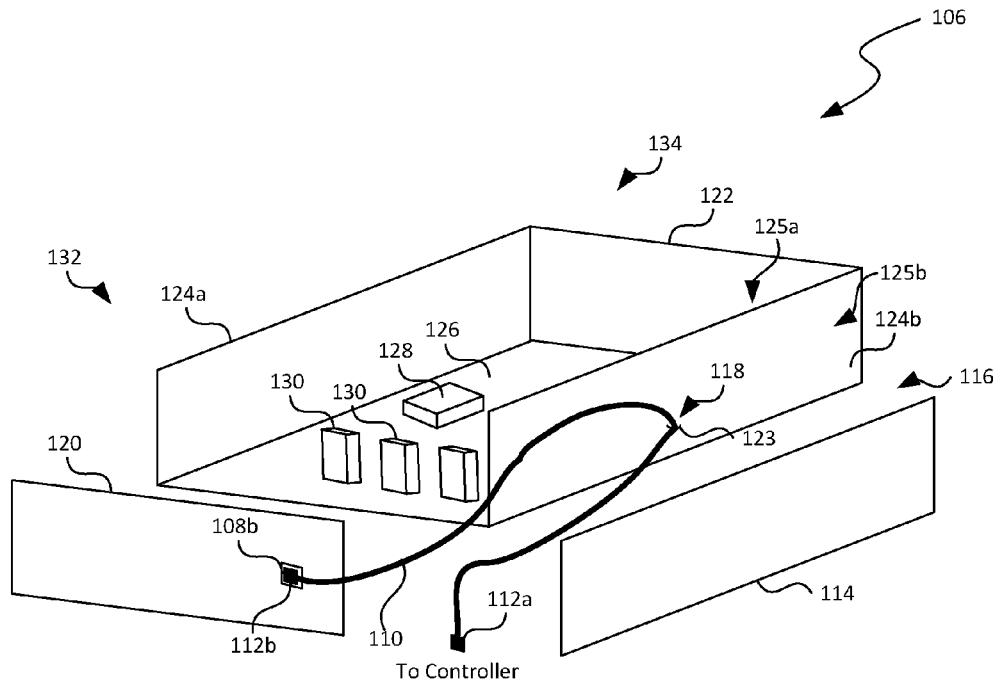
FIG. 6 is an exploded schematic perspective view of a further electronic enclosure suitable for the computing system in FIG. 1 in accordance with embodiments of the present technology.

FIG. 6 is an exploded schematic perspective view of a further electronic enclosure 106 suitable for the computing system 100 in FIG. 1 in accordance with embodiments of the present technology. Unlike the embodiments shown in FIGS. 1-5, the cable anchor 118 does not include a distinct structure. Instead, as shown in FIG. 6, the cable anchor 118 can include a point in the cable 110 that is fixedly attached to the second side 125b of the second side panel 124b using, for example, a clip 123, at a location inside the gap 116. In other embodiments, the cable 110 can also be fixed attached to the second side panel 124b using a cable tie, clamp, or other suitable types of fastener. In further embodiments, the electronic enclosure 106 can include two, three, or any other suitable number of points in the cable 110 that are fixed attached to the second side 125b of the second side panel 124b using any suitable fasteners.

Figure 7:
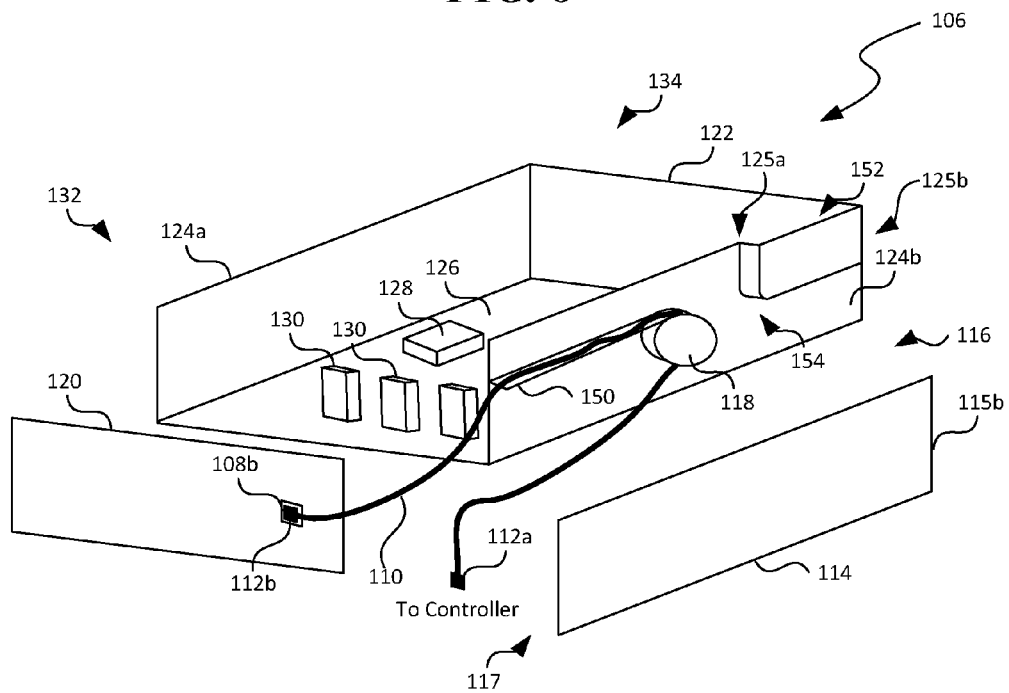
FIG. 7 is an exploded schematic perspective view of a yet further electronic enclosure suitable for the computing system in FIG. 1 in accordance with embodiments of the present technology.
Figure 8:
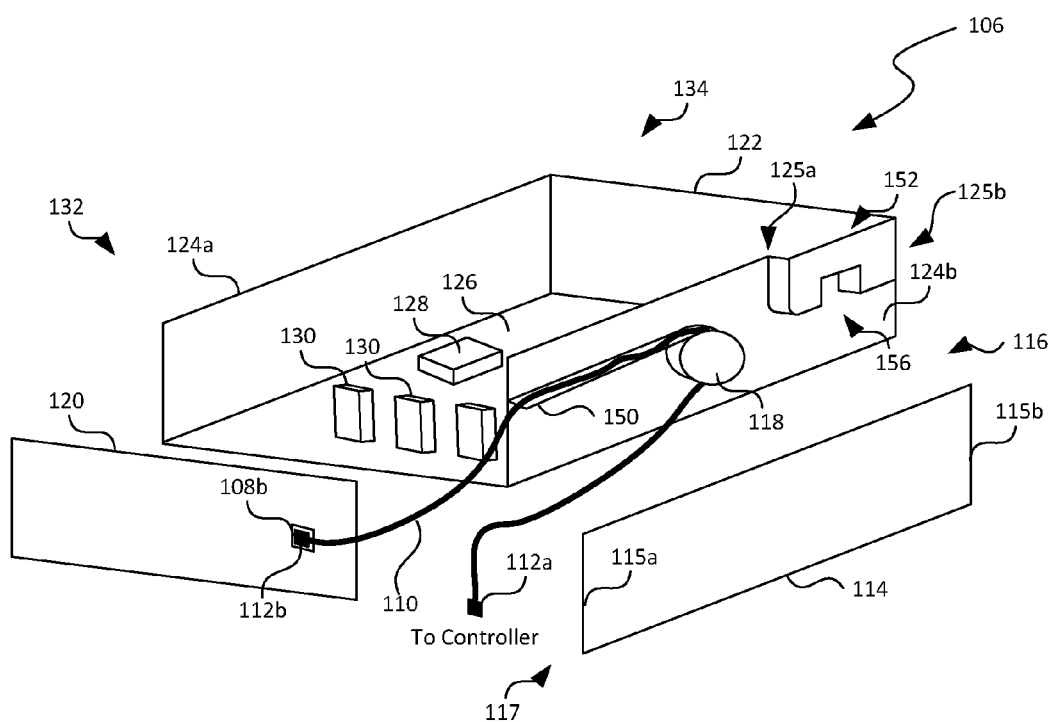
FIG. 8 is an exploded schematic perspective view of another electronic enclosure suitable for the computing system in FIG. 1 in accordance with embodiments of the present technology.

FIG. 7 is an exploded schematic perspective view of a further electronic enclosure 106 suitable for the computing system 100 in FIG. 1 in accordance with embodiments of the present technology. Unlike the embodiments shown in FIGS. 1-6, the electronic enclosure 106 can include an extension structure 152 jutted into the gap 116 proximate to the back end 134 of the electronic enclosure 106. In the illustrated embodiment, the extension structure 152 can be a part of the second side panel 124b. As such, the extension structure 152 can enlarge the interior space 127 of the electronic enclosure 106 when compared to that shown in FIG. 2. In other embodiments, the extension structure 152 can be attached to the second side panel 124b. As shown in FIG. 7, the extension structure 152 can include a rounded corner 154 to facilitate bending of the cable 110. In other embodiments, as shown in FIG. 8, the extension structure 152 can also include one or more notches 154 (only one is shown for illustration purposes) and/or other suitable structural features.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A computer assembly, comprising:
 one or more computer storage devices;
 an enclosure housing the one or more computer storage devices, wherein the enclosure includes:
  a front panel, a back panel, and a side panel between the front panel and the back panel, the side panel having a first side facing an interior space housing the one or more computer storage devices and a second side opposite the first side;
  a guide panel proximate to the side panel, the guide panel being spaced apart from the second side of the side panel by a gap extending at least partially between the front panel and the back panel, the gap having an opening proximate the front panel; and
  a cable anchor located in the gap between the side panel and the guide panel, the cable anchor extending from the second side of the side panel toward the guide panel; and
  a cable extending into the opening of the gap, around the cable anchor in the gap, and exiting the gap through the opening.

2. The computer assembly of claim 1 wherein:
 the gap has a width between the second side of the side panel and the guide panel;
 the cable anchor has a dimension that extends between the second side of the side panel and the guide panel; and the dimension of the cable anchor approximately equals the width of the gap.

3. The computer assembly of claim 1 wherein:
the gap has a width between the second side of the side panel and the guide panel;
the cable anchor has a dimension that extends between the second side of the side panel and the guide panel; and
the dimension of the cable anchor is less than the width of the gap.

4. The computer assembly of claim 1 wherein:
the front panel includes a communications port;
the cable includes a first terminal engaged with the communications port; and
the cable includes a second terminal exiting the opening of the gap proximate to the front panel.

5. The computer assembly of claim 1 wherein:
the front panel includes a communications port;
the cable includes a first terminal engaged with the communications port; and
the cable includes a second terminal exiting the opening of the gap proximate to the front panel; and
a portion of the cable inside the gap forms a half loop when the enclosure is in a retracted position.

6. The computer assembly of claim 1 wherein:
the front panel includes a communications port;
the cable includes a first terminal engaged with the communications port; and
the cable includes a second terminal exiting the opening of the gap proximate to the front panel; and
the cable extends in a linear fashion between the first and second terminals when the enclosure is in an open position.

7. The computer assembly of claim 1 wherein the guide panel is attached to support structures that carry the computer assembly, and wherein the guide panel is stationary with respect to a movement of the computer assembly.

8. The computer assembly of claim 1 wherein the cable anchor includes a generally cylindrical structure extending from the second side of the side panel toward the guide panel.

9. The computer assembly of claim 1 wherein the cable anchor includes a point in the cable that is fixedly attached to the second side of the side panel.

10. An enclosure for holding computer components, comprising:
a front panel, a back panel, and a side panel between the front panel and the back panel, the side panel having a first side facing an interior space of the enclosure and a second side facing away from the first side;
a guide panel proximate to the side panel, the guide panel being spaced apart from the second side of the side panel by a gap extending at least partially between the front panel and the back panel, the gap having an opening proximate the front panel;
a cable anchor fixedly attached to the second side of the side panel and located in the gap between the side panel and the guide panel, the cable anchor extending from the second side of the side panel toward the guide panel; and
a cable extending into the opening, around the cable anchor, and exit the gap through the same opening of the gap, the cable having a first end opposite a second end, both the first and second ends being proximate the front panel.

11. The enclosure of claim 10 wherein:
the gap has a width between the second side of the side panel and the guide panel;
the cable anchor has a dimension that extends between the second side of the side panel and the guide panel; and
the dimension of the cable anchor approximately equals the width of the gap.

12. The enclosure of claim 10 wherein:
the gap has a width between the second side of the side panel and the guide panel;
the cable anchor has a dimension that extends between the second side of the side panel and the guide panel; and
the dimension of the cable anchor is less than the width of the gap.

13. The enclosure of claim 10 wherein the front panel includes a communications port configured to receive a terminal of the cable.

14. The enclosure of claim 10 wherein the front panel includes a communications port configured to receive a first terminal of the cable, and wherein the cable includes a second terminal to be coupled to an external enclosure.

15. The enclosure of claim 10 wherein the cable having a portion inside the gap forming a half loop around the cable anchor, and wherein the cable anchor is configured to prevent the half loop from moving toward the front panel of the enclosure.

16. The enclosure of claim 10 wherein the cable anchor includes a generally cylindrical structure extending from the second side of the side panel toward the guide panel.

17. The enclosure of claim 10 wherein the cable anchor includes a point in the cable that is fixedly attached to the second side of the side panel.

18. The enclosure of claim 10 wherein the guide panel is configured to be stationary with respect to a movement of the side panel.

19. A method of installing a cable having a first terminal and a second terminal on a first slide mounted enclosure and second slide mounted enclosure, respectively, in a computing system, the method comprising:
engaging the first terminal of the cable with a communications port on a front panel of the first slide mounted enclosure, the first slide mounted enclosure also having:
a back panel opposite the front panel and a side panel between the front panel and the back panel, wherein the side panel includes a first side facing an interior space of the enclosure and a second side facing away from the first side; and
a guide panel proximate to the side panel, the guide panel being spaced apart from the second side of the side panel by a gap extending at least partially between the front panel and the back panel, the gap having an opening proximate the front panel;
a cable anchor directly attached to the second side of the side panel and located in the gap between the side panel and the guide panel, the cable anchor extending from the second side of the side panel toward the guide panel;
routing the cable into the opening of the gap toward the back panel, around the cable anchor in the gap, and exiting the gap via the same opening of the gap; and
engaging the second terminal of the cable with another communications port on another front panel of the second slide mounted enclosure.

20. The method of claim 19 wherein routed cable includes a portion located inside the gap, and wherein the method further includes setting a length of the portion located inside the gap to approximately equal to or greater than a travel distance of the slide mounted enclosure.

* * * * *